(12) United States Patent
Liu et al.

(10) Patent No.: US 12,727,085 B2
(45) Date of Patent: Sep. 1, 2026

(54) FLEXIBLE CIRCUIT BASE BOARD AND FLEXIBLE FLAT CABLE

(71) Applicants: Avary Holding (Shenzhen) Co., Ltd., Shenzhen (CN); QingDing Precision Electronics (Huai'an) Co., Ltd., Jiangsu Province (CN); Garuda Technology Co., Ltd., New Taipei City (TW)

(72) Inventors: Dong-Mei Liu, Shenzhen (CN); Honey Hou, Shenzhen (CN); Biao Li, Shenzhen (CN)

(73) Assignees: AVARY HOLDING (SHENZHEN) CO., LTD., Shenzhen (CN); QINGDING PRECISION ELECTRONICS (HUAI'AN) CO., LTD., Jiangsu Province (CN); GARUDA TECHNOLOGY CO., LTD., New Taipei City (TW)

( * ) Notice: Subject to any disclaimer, the term of this patent is extended or adjusted under 35 U.S.C. 154(b) by 209 days.

(21) Appl. No.: 18/807,460

(22) Filed: Aug. 16, 2024

(65) Prior Publication Data

US 2026/0052629 A1 Feb. 19, 2026

(51) Int. Cl.
*H01B 7/04* (2006.01)
*H01B 7/08* (2006.01)
(Continued)

(52) U.S. Cl.
CPC ............... *H05K 1/118* (2013.01); *H01B 7/04* (2013.01); *H01B 7/08* (2013.01); *H01M 50/569* (2021.01);
(Continued)

(58) Field of Classification Search
CPC ... H01M 50/569; H05K 1/118; H05K 1/0293; H05K 1/095; H05K 1/117; H05K 1/189;
(Continued)

(56) References Cited

U.S. PATENT DOCUMENTS 6,723,925 B2 * 4/2004 Ohara ................. B60R 16/0207 174/117 FF
2022/0076697 A1 3/2022 Sato
2022/0295630 A1 * 9/2022 Misawa ............... H05K 1/0245

FOREIGN PATENT DOCUMENTS

CN 203691758 U 7/2014
CN 114649650 A 6/2022
CN 117079867 A 11/2023

* cited by examiner

*Primary Examiner* — Timothy J Thompson
*Assistant Examiner* — Michael F McAllister
(74) *Attorney, Agent, or Firm* — MUNCY, GEISSLER, OLDS & LOWE, P.C.

(57) ABSTRACT

A flexible circuit base board and a flexible flat cable are provided. The flexible flat cable includes the flexible circuit base board and a transmission element. The flexible circuit base board includes a base film, multiple conductive wires, a transmission signal pad, a conductive structure, a collecting signal pad and a cover film. The conductive wires are spaced and placed on the base film. The transmission signal pad and the collecting signal pad are electrically connected to and are disposed on the base film. The conductive structure is disposed on the base film, and is electrically connected to at least one of the conductive wires and the transmission signal pad. The cover film is disposed on the base film, and covers the conductive wires, the conductive structure, the transmission signal pad, and the collecting signal pad. The transmission element is electrically connected to the collecting signal pad.

17 Claims, 5 Drawing Sheets

(51) Int. Cl.
*H01M 50/569* (2021.01)
*H05K 1/09* (2006.01)
*H05K 1/11* (2006.01)
*H05K 3/28* (2006.01)

(52) U.S. Cl.
CPC ............. *H05K 1/095* (2013.01); *H05K 3/284* (2013.01); *H05K 2201/09409* (2013.01); *H05K 2201/10181* (2013.01)

(58) Field of Classification Search
CPC ...... H05K 3/284; H05K 3/3405; H05K 3/363; H05K 2201/09409; H05K 2201/10181; H01B 7/04; H01B 7/08
USPC .......................................................... 174/254
See application file for complete search history.

FLEXIBLE CIRCUIT BASE BOARD AND FLEXIBLE FLAT CABLE

BACKGROUND

Technical Field

The present application relates to a flexible circuit base board and a flexible flat cable.

Description of Related Art

Existing flexible flat cables (FFCs) have been applied to electric vehicles. For example, a flexible flat cable can be connected between multiple metal conductors of a cell contact system (CCS) and a battery management system (BMS) in an electric vehicle, so that signals from battery cells can be transmitted through the metal conductors to the flexible flat cable, and then through the flexible flat cable and a connector to the battery management system. However, a distance between the metal conductors is different from a pin distance of the connector, so that the flexible flat cable connected between the cell contacting system and the battery management system further needs to use an adapter board to complete a connection, thus causing the inconvenience of use.

SUMMARY

At least one embodiment of the present application provides a flexible circuit base board and a flexible flat cable. The flexible flat cable has an internal jumper wire and thus can be connected between two electronic devices having different connection distances without the use of an adapter board.

The flexible circuit base board provided according to at least one embodiment of the present application comprises a base film, multiple conductive wires, a transmission signal pad, a conductive structure and a cover film. The base film has a pair of sides that are opposite to each other. The conductive wires are spaced and placed side by side on the base film. The transmission signal pad is disposed on the base film, and is located between one of the sides and the multiple conductive wires. The conductive structure is disposed on the base film, the multiple conductive wires and the transmission signal pad, and is electrically connected to at least one of the multiple conductive wires and the transmission signal pad. The cover film is disposed on the base film, and covers the multiple conductive wires, the conductive structure and the transmission signal pad.

The flexible flat cable provided according to at least one embodiment of the present application comprises a flexible circuit base board and a transmission element. The flexible circuit base board comprises a base film, multiple conductive wires, a transmission signal pad, a conductive structure, a collecting signal pad and a cover film. The base film has a pair of sides that are opposite to each other. The conductive wires are spaced and placed side by side on the base film. The transmission signal pad is disposed on the base film, and is located between one of the sides and the multiple conductive wires. The conductive structure is disposed on the base film, the multiple conductive wires and the transmission signal pad, and is electrically connected to at least one of the multiple conductive wires and the transmission signal pad. The collecting signal pad is disposed on the base film, and is located between one of the sides and the multiple conductive wires. The collecting signal pad is electrically connected to the transmission signal pad. The cover film is disposed on the base film, and covers the multiple conductive wires, the conductive structure, the transmission signal pad, and the collecting signal pad. The transmission element is electrically connected to the collecting signal pad, and the transmission element and the conductive structure define an electrical conduction through the collecting signal pad. The transmission element does not cover the multiple conductive wires and protrudes beyond the pair of sides.

Based on the above, in the flexible flat cables disclosed in the above embodiments, each conductive structure is electrically connected to at least one conductive wire and one transmission signal pad, so that the flexible flat cable can be connected between two electronic devices having different connection distances without the use of an adapter board, thereby increasing the convenience of use.

BRIEF DESCRIPTION OF THE DRAWINGS

For a more complete understanding of embodiments and their advantages, now reference is made to the following descriptions with reference to the Drawings, in which.

DETAILED DESCRIPTION

Figure 1:
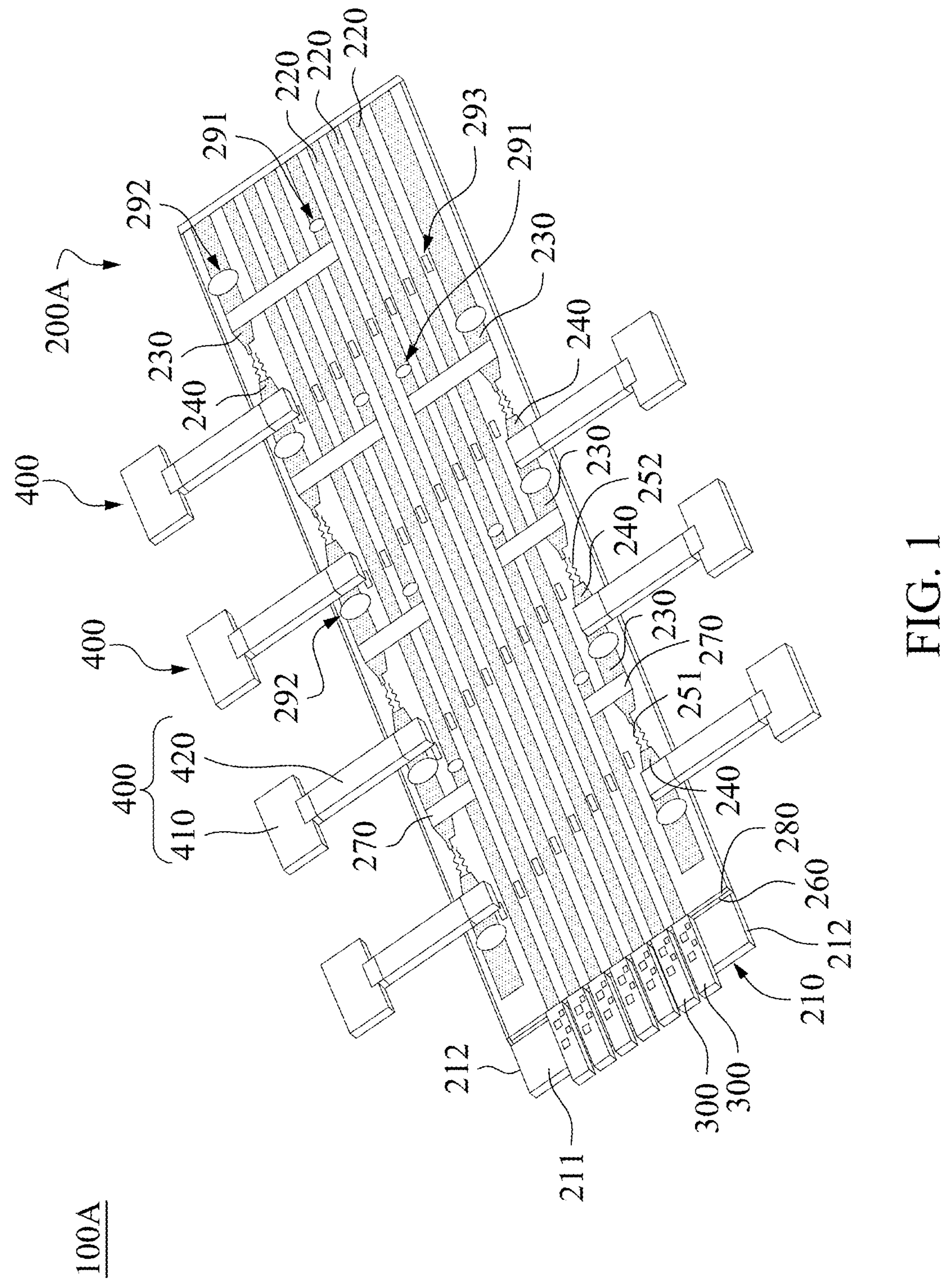
FIG. 1 is a perspective view of a flexible flat cable according to at least one embodiment of the present application.

For clearly introducing the technical features of the present application below, the dimensions (such as length, width, thickness, and depth) of components (such as layers, films, base boards, and areas) in the figures will be scaled up disproportionately, and the number of some components will be reduced. Accordingly, the description and interpretation of the following embodiments shall not be limited to the number of components and the dimensions and shapes of the components shown in the figures, but shall encompass dimensions, shapes and deviations therebetween as a result of actual manufacturing processes and/or tolerances. For example, a flat surface shown in a figure may have a feature of roughness and/or nonlinearity, while an acute angle shown in a figure may be circular. Therefore, the components shown in the present application are mainly used for schematic purposes, and are not intended to accurately depict the actual shapes of the components, nor are they used to limit the claims of the patent application.

Secondly, the words “about”, “approximately” or “substantially” appearing herein encompass not only clearly recorded values and ranges of values, but also allowable deviation ranges understood by persons of ordinary skill in the art, in which the deviation ranges may be determined by errors resulting from measurements, and the errors are due, for example, to limitations of both a measuring system and process conditions. In addition, the word “about” can mean within one or more standard deviations of the above values, such as ±30%, ±20%, ±10% or ±5%. The terms “about”, “approximately” or “substantially” and the like used in the present application may be used to select acceptable deviation ranges or standard deviations based on optical, etchable, mechanical or other properties, rather than a single standard deviation to apply all of the above optical, etchable, mechanical or other properties. In addition, for the purpose of clearly illustrating the following embodiments, functionally identical or similar components are indicated by reference numerals.

FIG. 1 is a perspective view of a flexible flat cable 100A according to at least one embodiment of the present application. Referring to FIG. 1, the flexible flat cable 100A is suitable to be connected between at least two electronic devices, and is configured to transmit signals. For example, the flexible flat cable 100A is connected between multiple metal conductors of a cell contacting system and a connector of a battery management system, but is not limited to this. The flexible flat cable 100A includes a flexible circuit base board 200A, multiple connecting terminals 300 and at least one transmission element 400. In an example of FIG. 1, multiple transmission elements 400 are illustrated.

Figure 2:
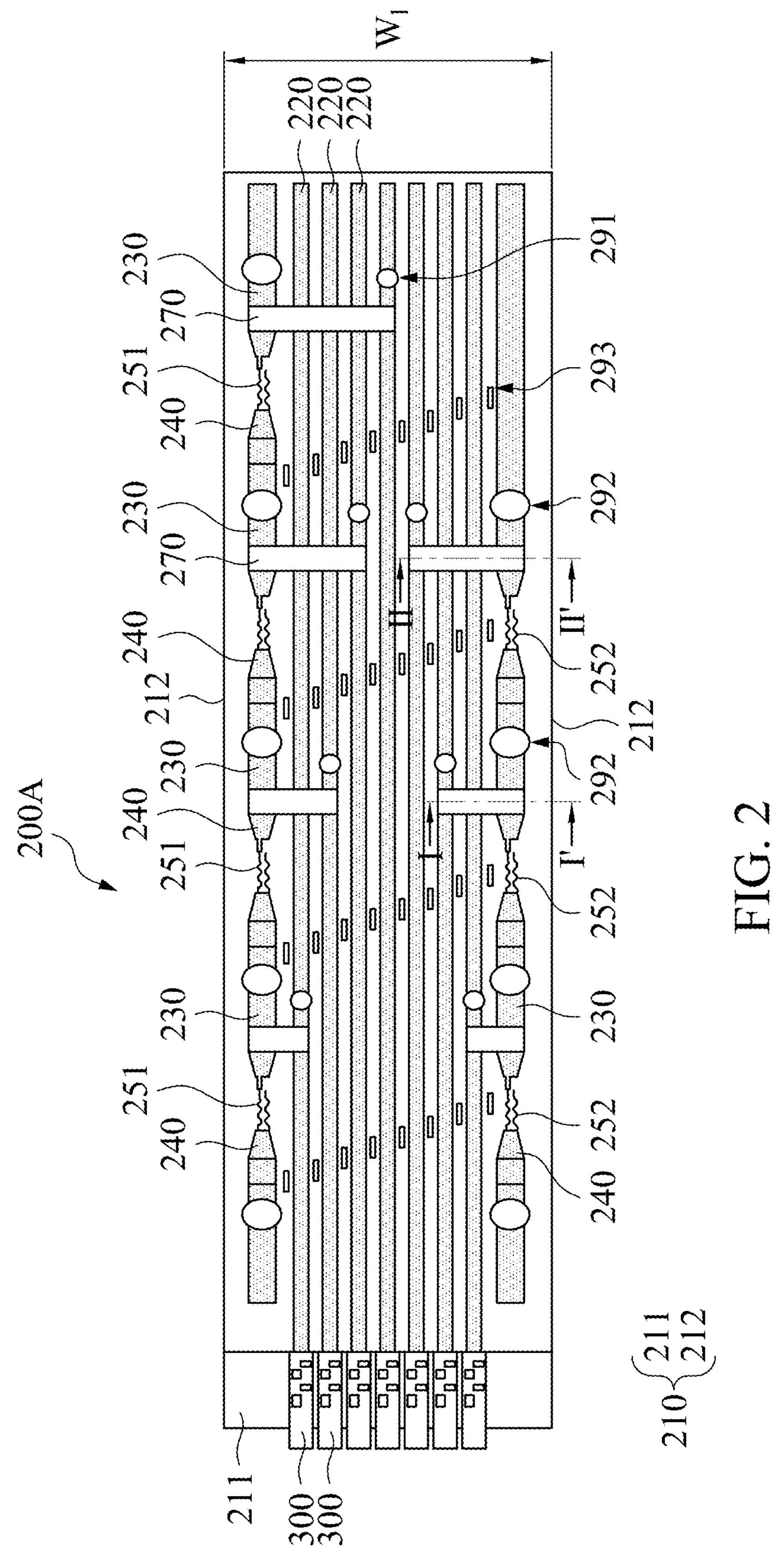
FIG. 2 is a top view of a flexible circuit base board and multiple connecting terminals of the flexible flat cable in FIG. 1.
Figure 3B:
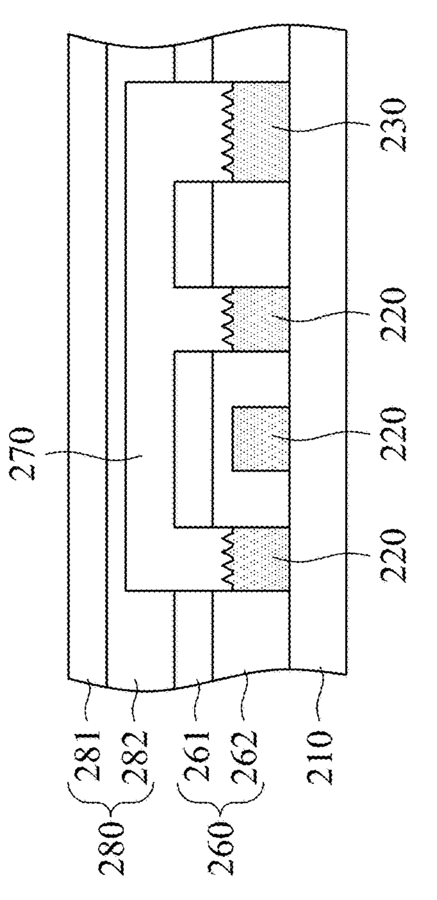
FIG. 3B is a cross-sectional view along a section line II-II' in FIG. 2.
Figure 3A:
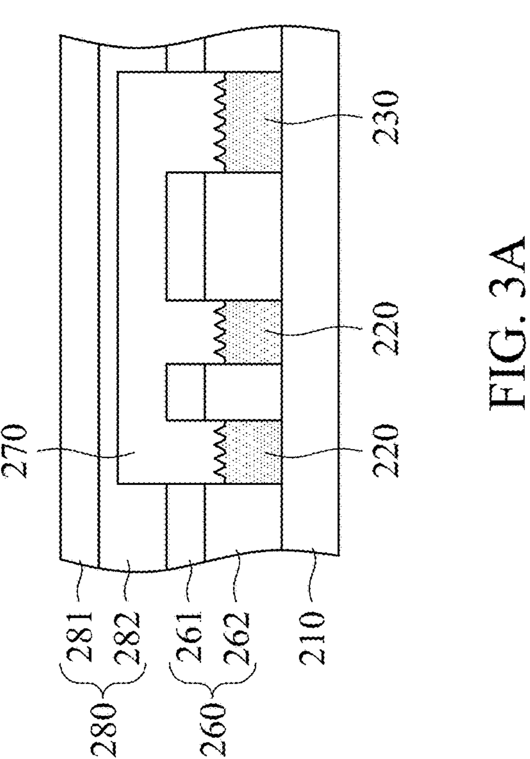
FIG. 3A is a cross-sectional view along a section line I-I' in FIG. 2.

FIG. 2 is a top view of the flexible circuit base board 200A and the multiple connecting terminals 300 in FIG. 1. FIG. 3A and FIG. 3B are cross-sectional views along a section line I-I' and a section line II-II' in FIG. 2. Referring to FIGS. 2, 3A and 3B, the flexible circuit base board 200A includes a base film 210, multiple conductive wires 220, at least one transmission signal pad 230, at least one collecting signal pad 240, at least one fuse wire 251, at least one repair wire 252, an insulating film 260, at least one conductive structure 270, and a cover film 280. With FIG. 1 as an example, the flexible circuit base board 200A includes multiple transmission signal pads 230, multiple collecting signal pads 240, multiple fuse wires 251, multiple repair wires 252, and multiple conductive structures 270.

It should be noted that in FIGS. 1 and 2, the insulating film 260 covers the multiple conductive wires 220, the multiple transmission signal pads 230, the multiple collecting signal pads 240, the multiple fuse wires 251 and the multiple repair wires 252, and the cover film 280 covers the multiple conductive structures 270. Thus, in actual situations, the conductive wires 220, the transmission signal pads 230, the collecting signal pads 240, the fuse wires 251, the repair wires 252, and the conductive structures 270 in FIGS. 1 and 2 will be covered by the insulating film 260 or the cover film 280. However, for clear display, FIGS. 1 and 2 show the aforementioned components in solid lines (e.g., the conductive wires 220, the transmission signal pads 230, the collecting signal pads 240, and the fuse wires 251).

The base film 210 may be rectangular in shape. The base film 210 has a connecting portion 211 and a pair of sides 212. The connecting portion 211 corresponds to the connector connected to the battery management system. The pair of sides 212 is located on both sides of the connecting portion 211 and opposite to each other. The base film 210 can be made of polyimide (PI), polyethylene terephthalate (PET) or polyethylene naphthalate (PEN).

The multiple conductive wires 220 are spaced and placed side by side on the base film 210. The conductive wires 220 extend in a middle area of the base film 210, and the conductive wires 220 may extend along the sides 212. The conductive wires 220 can be made of copper or aluminum. The width of each of the conductive wires 220 may range from 500 microns (um) to 1000 microns. The thickness of each of the conductive wires 220 may range from 50 microns to 150 microns. For example, the width and the thickness of each of the conductive wires 220 may be 700 microns and 100 microns respectively.

The multiple transmission signal pads 230 are disposed on the base film 210. In the example of FIGS. 1 and 2, some transmission signal pads 230 are located between one of the sides 212 and the multiple conductive wires 220, while some other transmission signal pads 230 are located between the other side 212 and the multiple conductive wires 220. That is, the multiple transmission signal pads 230 are adjacent to the two sides 212 of the base film 210 respectively. The multiple collecting signal pads 240 are also disposed on the base film 210, some of which are located between one of the sides 212 and the multiple conductive wires 220, and some of which are located between the other side 212 and the multiple conductive wires 220. The multiple collecting signal pads 240 are adjacent to the two sides 212 of the base film 210 respectively.

In particular, the multiple fuse wires 251 are disposed on the base film 210 and respectively connected to the multiple transmission signal pads 230 and the multiple collecting signal pads 240, such that the multiple transmission signal pads 230 are respectively electrically connected to the multiple collecting signal pads 240. The multiple fuse wires 251 are configured to protect the flexible circuit base board 200A to prevent an excessive current between the transmission signal pads 230 and the collecting signal pads 240 from burning out the flexible circuit base board 200A, so the fuse wires 251 function as fuses.

When a current flowing through any of the fuse wires 251 exceeds a rated current, the fuse wire 251 is blown so that a circuit break occurs between the transmission signal pad 230 and the collecting signal pad 240. For example, the fuse wire 251 can be configured to have a rated current of 10 amps and a fusing time of 5 seconds. The fuse wire 251 may be an aluminum or copper wire with a diameter of 0.045-0.5 mm, but is not limited to this.

The multiple repair wires 252 are also disposed on the base film 210. The multiple repair wires 252 correspond to the multiple fuse wires 251 respectively, and are used as spare wires for the multiple fuse wires 251. The material of the multiple repair wires 252 may be similar to that of the multiple fuse wires 251. Each of the repair wires 252 is adjacent to, but not in contact with, the corresponding fuse wire 251, that is, the repair wire 252 and the fuse wire 251 adjacent to each other are not electrically conductive. The multiple repair wires 252 may be connected to the multiple transmission signal pads 230 or the multiple collecting signal pads 240, respectively.

When any of the fuse wires 251 is blown, the corresponding repair wire 252 can then be connected to the corresponding transmission signal pad 230 or the corresponding collecting signal pad 240 by means of welding, so that the corresponding transmission signal pad 230 and the corresponding collecting signal pad 240 can be electrically connected again. In the example of FIG. 2, each of the repair wires 252 is connected to the corresponding collecting signal pad 240. It shall be noted that in other embodiments, the flexible circuit base board 200A may have no fuse wire 251 and repair wire 252, i.e., the transmission signal pads 230 and the collecting signal pads 240 are electrically connected directly.

The insulating film 260 is disposed on the base film 210 and covers the multiple conductive wires 220, the multiple transmission signal pads 230, the multiple collecting signal pads 240, the multiple fuse wires 251 and the multiple repair wires 252. For example, the insulating film 260 may include a flexible material 261 and an insulating adhesive 262. The insulating film 260 can be bonded to the base film 210 by the insulating adhesive 262 to cover the multiple conductive wires 220, the multiple transmission signal pads 230, the multiple collecting signal pads 240, the multiple fuse wires 251 and the multiple repair wires 252. The flexible material 261 of the insulating film 260 may be the same or similar to the material of the base film 210, e.g., the flexible material such as polyimide (PI), polyethylene terephthalate (PET) or polyethylene naphthalate (PEN).

Further, multiple first openings (i.e., areas to be subsequently connected to the conductive structures 270) are formed on the insulating film 260 at external areas of the multiple conductive wires 220 and partial areas of the multiple transmission signal pads 230 to expose partial surfaces of the multiple conductive wires 220 and partial surfaces of the multiple transmission signal pads 230. Multiple second openings (i.e., areas to be subsequently connected to the transmission elements 400) are formed on the insulating film 260 at partial areas of the multiple collecting signal pads 240 respectively to expose partial surfaces of the multiple collecting signal pads 240. The exposed surfaces of the external areas of the multiple conductive wires 220 and the partial areas of the multiple transmission signal pads 230 are then subjected to a micro-etching process to form rough surfaces, as shown in FIGS. 3A and 3B. In addition, each of the conductive wires 220 may have one or more external areas.

It should also be noted that the flexible flat cable 100A may have multiple cut-off holes 291, 292. The cut-off holes 291 are located on the multiple conductive wires 220 respectively, and extend from the insulating film 260 through the conductive wires 220 and the base film 210. In particular, in each of the conductive wire 220, the external area of the conductive wire 220 may be located between the end portion and the cut-off hole 291. The cut-off holes 292 are located on the multiple transmission signal pads 230 or the multiple collecting signal pads 240 respectively, and extend from the insulating film 260 through the transmission signal pads 230 or the collecting signal pads 240 and then extend through the base film 210. The cut-off holes 291 and 292 are used to disconnect undesired signal paths. The shapes of the cut-off holes 291, 292 may be circular, oval, square or other suitable shapes.

The flexible flat cable 100A may also have multiple anti-tear holes 293. The anti-tear holes 293 extend from the insulating film 260 through the base film 210, and are located among the multiple conductive wires 220, the multiple transmission signal pads 230 and the multiple collecting signal pads 240. Therefore, the anti-tear holes 293 do not overlap with the conductive wires 220, the transmission signal pads 230 and the collecting signal pads 240. The anti-tear holes 293 can prevent the base film 210 and the insulating film 260 from being fractured due to bending.

The multiple conductive structures 270 are disposed on the base film 210, the multiple conductive wires 220, the multiple transmission signal pads 230 and the insulating film 260, and are in contact with the surfaces of the external areas of the multiple conductive wires 220 and the surfaces of the partial areas of the multiple transmission signal pads 230 from the first openings of the insulating film 260, so that the multiple conductive structures 270 are electrically connected to the multiple conductive wires 220 and the multiple transmission signal pads 230 respectively. In addition, the conductive structures 270 do not cover the multiple second openings (i.e., areas to be subsequently connected to the transmission elements 400), the multiple cut-off holes 291, 292, and the multiple anti-tear holes 293.

The conductive structures 270 may be anisotropic conductive films (ACFs) or solder pastes, and there is no limit to this. In particular, since the surfaces of the conductive wires 220 in contact with the conductive structures 270 are rough surfaces, bonding forces between the conductive structures 270 and the conductive wires 220 are increased. Similarly, since the surfaces of the transmission signal pads 230 in contact with the conductive structures 270 are rough surfaces, bonding forces between the conductive structures 270 and the transmission signal pads 230 are increased. The width and thickness of each of the conductive structures 270 may be similar to the width and thickness of each of the conductive wires 220, respectively, and there is no limit to this.

It should be noted that each of the conductive structures 270 may be electrically connected to a conductive wire 220 and a transmission signal pad 230. Alternatively, each of the conductive structures 270 may also be electrically connected to multiple conductive wires 220 and a transmission signal pad 230. For example, as shown in FIG. 3A, the conductive structure 270 is electrically connected to two adjacent conductive wires 220 and a transmission signal pad 230. As shown in FIG. 3B, the conductive structure 270 is electrically connected to two non-adjacent conductive wires 220 and a transmission signal pad 230. Signals transmitted on the transmission signal pads 230 are transmitted to the corresponding conductive wires 220 via the conductive structures 270 respectively.

The cover film 280 is disposed on the base film 210, the multiple conductive wires 220, the multiple transmission signal pads 230, the multiple collecting signal pads 240, the insulating film 260, and the multiple conductive structures 270 to cover the conductive wires 220, the transmission signal pads 230, the collecting signal pads 240, the insulating film 260, and the conductive structures 270. Further, the cover film 280 may extend into the cut-off holes 291, 292 and the anti-tear holes 293 and are in contact with the base film 210. The cut-off holes 291, 292 and anti-tear holes 293 may be filled with the cover film 280 to prevent the flexible circuit base board 200A from being torn or the conductive wires 220 from being destroyed due to the cut-off holes 291, thereby affecting an impedance value.

The cover film 280 may also include a flexible material 281 and an insulating adhesive 282. The cover film 280 may also be bonded to the insulating film 260 by the insulating adhesive 282 to cover the conductive structures 270 and to fill the cut-off holes 291, 292 and the anti-tear holes 293. The flexible material 281 of the cover film 280 may be the same or similar to the flexible material 261 of the insulating film 260, e.g., flexible material such as polyimide (PI), polyethylene terephthalate (PET) or polyethylene naphthalate (PEN).

Further, multiple third openings (areas to be subsequently connected to the transmission elements 400) are formed on the cover film 280 at the locations corresponding to the second openings (partial areas of the multiple collecting signal pads 240) to expose partial surfaces of the multiple collecting signal pads 240.

Reference is made to FIGS. 1 and 2, and the multiple connecting terminals 300 are electrically connected to the multiple conductive wires 220 respectively. The number of the connecting terminal 300 is the same as the number of the conductive wire 220. The connecting terminals 300 are disposed at end portions of the conductive wires 220 respectively. The connecting terminals 300 may be punctured crimp terminals, that is, the connecting terminals 300 may be in contact with the end portions of the multiple conductive wires 220 by puncturing and crimp, and there is no limit to this. The multiple connecting terminals 300 are removably connected to the connector of the battery management system. That is, when the connecting terminals 300 are separated from the connector, an overall structure of the connecting terminals 300 and the connector will not be damaged.

The multiple transmission elements 400 are electrically connected to the multiple collecting signal pads 240 respectively. In detail, the transmission elements 400 are electrically connected to the partial surfaces of the multiple collecting signal pads 240 exposed to the multiple second openings and the multiple third openings. The transmission elements 400 do not cover the conductive wires 220 and protrude beyond the two sides 212 respectively. The transmission elements 400 are electrically connected to the collecting signal pads 240, and are electrically connected to the conductive structures 270 through the collecting signal pads 240 and the transmission signal pads 230.

Each of the transmission elements 400 includes a contact portion 410 and a connecting portion 420. The contact portions 410 are in electrical contact with multiple metal conductors of the cell contacting system, while the connecting portions 420 are electrically connected between the contact portions 410 and the collecting signal pads 240. The lengths of the connecting portions 420 can be adjusted according to the locations of the metal conductors, that is, the lengths of the connecting portions 420 may be the same or different, and there is no limit to this. The contact portions 410 may be aluminum sheets, and the connecting portions 420 may be nickel sheets, and there is no limit to this.

For example, when the cell contacting system transmits signals to the battery management system via the flexible flat cable 100A, the multiple transmission elements 400 respectively capture multiple signals from multiple battery cells of the cell contacting system and transmit the signals to the collecting signal pads 240. The signals are then transmitted to the conductive structures 270 via the fuse wires 251 and the transmission signal pads 230, and are transmitted to the corresponding conductive wires 220 via the conductive structures 270. The signals are then transmitted to the battery management system via the connecting terminals 300 and the connector.

It is worth mentioning that a method of manufacturing the flexible flat cable 100A in FIG. 1 is described as follows. Referring to FIGS. 1 and 2, first, a base film 210 is provided. Multiple conductive wires 220 and two metal wires are then disposed on the base film 210, where the conductive wires 220 and the metal wires are calendered to appropriate dimensions. The multiple conductive wires 220 are located in a middle area of the base film 210 and are spaced and placed side by side. One of the metal wires is located between one of sides 212 and the multiple conductive wires 220, and the other metal wire is located between the other side 212 and the multiple conductive wires 220, so that the two metal wires are adjacent to the two sides 212 respectively. The two wires are then patterned to form multiple transmission signal pads 230, multiple collecting signal pads 240, multiple fuse wires 251, and multiple repair wires 252. For example, patterning the two metal wires can be done by stamping, or by laser cutting.

With reference to FIGS. 3A and 3B, an insulating film 260 is then disposed on the base film 210 to cover the multiple conductive wires 220, the multiple transmission signal pads 230, the multiple collecting signal pads 240, the multiple fuse wires 251 and the multiple repair wires 252. Next, multiple first openings and multiple second openings can be formed on the insulating film 260 by means of laser cutting. The first openings expose partial surfaces of the multiple conductive wires 220 and partial surfaces of the multiple transmission signal pads 230 (i.e., areas to be subsequently connected to the conductive structures 270). The second openings expose partial surfaces of the multiple collecting signal pads 240 (i.e., areas to be subsequently connected to the transmission elements 400). The base film 210, the multiple conductive wires 220 and the insulating film 260 are then punched to form multiple cut-off holes 291. Similarly, the base film 210, the transmission signal pads 230 and the insulating film 260 are punched to form multiple cut-off holes 292, and the base film 210, the collecting signal pads 240 and the insulating film 260 are punched to form multiple cut-off holes 292. Next, the base film 210 and the insulating film 260 are punched to form multiple anti-tear holes 293.

Then, partial surfaces of the multiple conductive wires 220 and partial surfaces of the multiple transmission signal pads 230 exposed to the first openings are micro-etched so that the partial surfaces form multiple rough surfaces. Then, a conductive material is disposed on the insulating film 260, and the conductive material is in contact with the rough surfaces through the first openings. For example, setting the conductive material can be done by coating. The conductive material can be an anisotropic conductive film or a solder paste. After that, the conductive material is solidified to form multiple conductive structures 270.

Next, the cover film 280 is provided on the base film 210, the multiple conductive wires 220, the multiple transmission signal pads 230, the multiple collecting signal pads 240, the insulating film 260, and the multiple conductive structures 270 to cover the conductive wires 220, the transmission signal pads 230, the collecting signal pads 240, the insulating film 260, and the conductive structures 270. In particular, the cover film 280 extends into the cut-off holes 291, 292 and the anti-tear holes 293 and is in contact with the base film 210. The multiple third openings (areas corresponding to the locations of the second openings and to be later connected to the transmission elements 400) can then be formed on the cover film 280 by means of laser cutting. The third openings expose partial surfaces of the multiple collecting signal pads 240. In this way, the manufacturing of the flexible circuit base board 200A is completed.

Next, multiple connecting terminals 300 are provided to connect the end portions of the multiple conductive wires 220 respectively. For example, the connecting terminals 300 may be electrically connected to the end portions of the multiple conductive wires 220 by means of punctured crimping. Then, the multiple transmission elements 400 are disposed on partial surfaces of the multiple collecting signal pads 240 exposed to the second openings and the third openings. For example, the transmission elements 400 may be electrically connected to the collecting signal pads 240 by means of welding. In this way, the manufacturing of the flexible flat cable 100A is completed.

Figure 4:
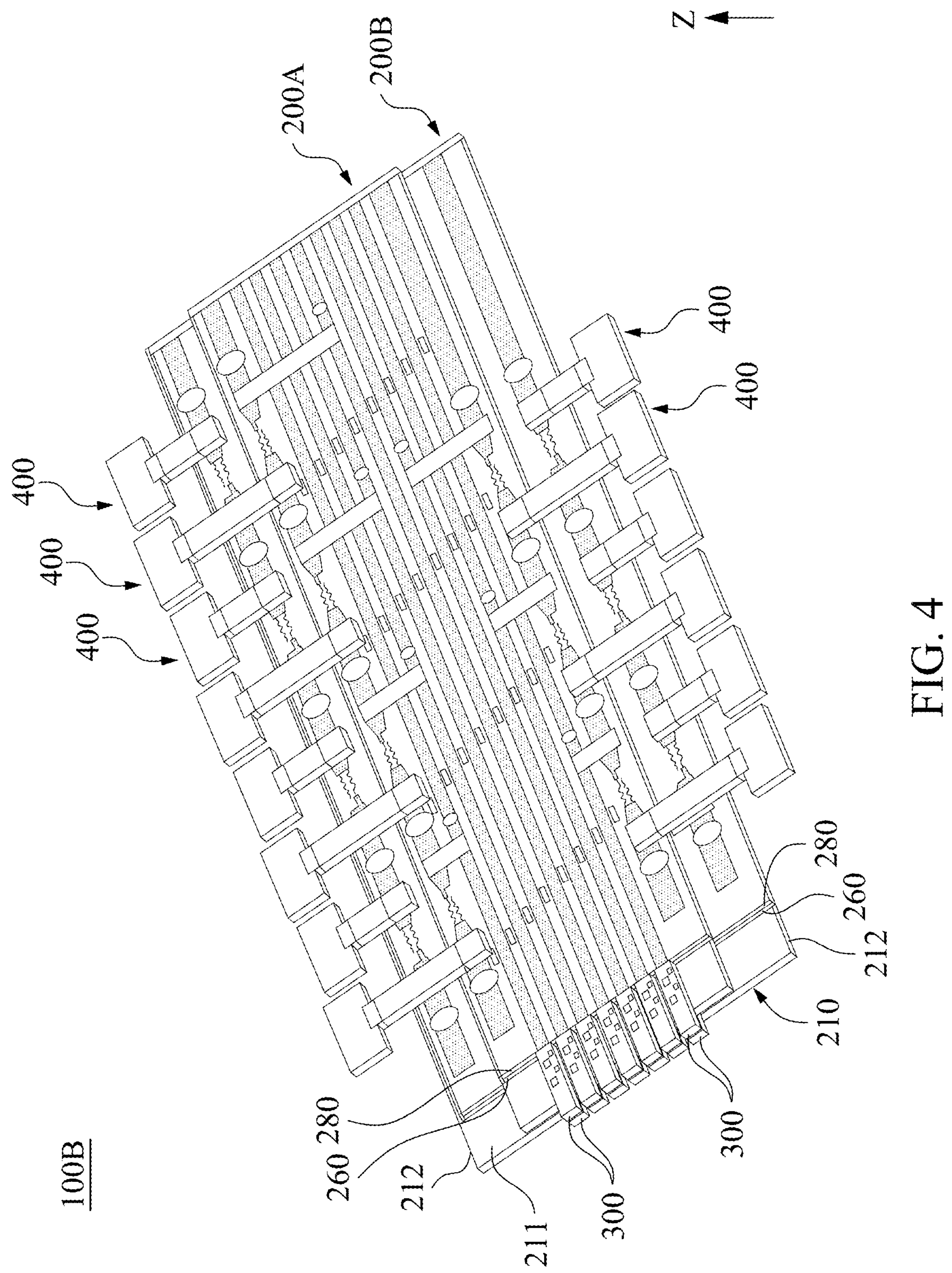
FIG. 4 is a perspective view of a flexible flat cable according to another embodiment of the present application.
Figure 5:
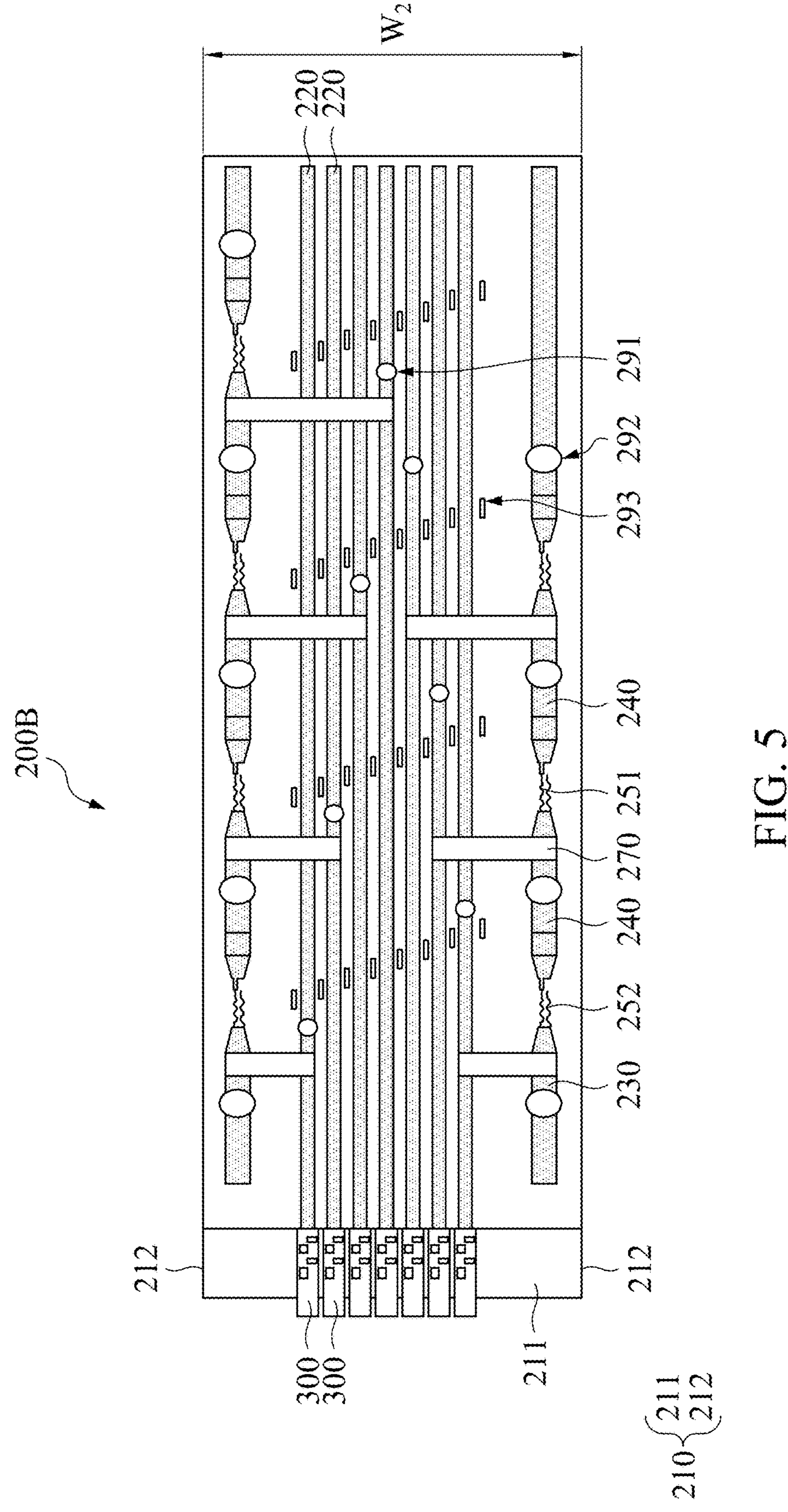
FIG. 5 is a top view of one of flexible circuit base boards and multiple connecting terminals of the flexible flat cable in FIG. 4.

FIG. 4 is a perspective view of a flexible flat cable 100B according to another embodiment of the present application. FIG. 5 is a top view of a flexible circuit base board 200B and multiple connecting terminals 300 of the flexible flat cable 100B in FIG. 4. Reference is made to FIGS. 4 and 5, and the flexible flat cable 100B is similar to the flexible flat cable 100A in FIG. 1, but the flexible flat cable 100B is different from the flexible flat cable 100A in that the flexible flat cable 100B includes multiple flexible circuit base boards. In an example of FIG. 4, the flexible flat cable 100B includes two flexible circuit base boards 200A and 200B, but is not limited to this. The top view of the flexible circuit base board 200A in FIG. 4 is shown in FIG. 2.

Reference is made to FIGS. 2, 4, and 5, and the flexible circuit base boards 200A and 200B are stacked, and the flexible circuit base board 200A is stacked on the upper side of the flexible circuit base board 200B. The structure of the flexible circuit base board 200B is similar to that of the flexible circuit base board 200A, except that two sides 212 of the flexible circuit base board 200B protrude beyond two sides 212 of the flexible circuit base board 200A, that is, the width $W_2$ of the flexible circuit base board 200B is greater than the width $W_1$ of the flexible circuit base board 200A. The multiple collecting signal pads 240 respectively located on the flexible circuit base board 200B and the flexible circuit base board 200A do not overlap, so that the multiple collecting signal pads 240 of the flexible circuit base board 200B are exposed. Therefore, the transmission elements 400 do not overlap and do not interfere with each other when they are disposed on the multiple collecting signal pads 240 of the flexible circuit base boards 200A and 200B, respectively.

In addition, when the multiple connecting terminals 300 are disposed on the flexible circuit base board 200A and the flexible circuit base board 200B, projections (vertical projections) of the connecting terminals 300 overlap in a direction Z. Thus, the flexible circuit base board 200A and the flexible circuit base board 200B can be connected to a same connector (with upper and lower slots) through the connecting terminals 300. Therefore, the flexible flat cable 100B can connect more metal conductors of the cell contacting system simultaneously than the flexible flat cable 100A, and signals of more battery cells can be captured.

It is worth mentioning that the flexible flat cable 100B can include three or more flexible circuit base boards. When the flexible circuit base boards are stacked, in any two adjacent flexible base boards, the two sides 212 of the lower flexible circuit base board may protrude beyond the two sides 212 of the upper flexible circuit base board. In addition, projections (vertical projections) of the connecting terminals 300 respectively disposed on the flexible circuit base boards overlap in the direction Z.

It should be noted that a method of manufacturing the flexible flat cable 100B in FIG. 4 is similar to the method of manufacturing the flexible flat cable 100A in FIG. 1, except that after the flexible circuit base boards 200A and 200B are completed separately and multiple connecting terminals 300 are disposed on the flexible circuit base boards 200A and 200B, the flexible circuit base boards 200A and 200B are stacked. A method of manufacturing the flexible circuit base board 200B is the same or similar to a method of manufacturing the flexible circuit base board 200A, which will not be repeated here. The flexible circuit base boards 200A and 200B may be bonded by using an adhesive and may be arranging a cushioning material such as aerogel or foam. In addition, the adhesive may include polyethylene terephthalate (PET) to achieve an effect of insulation. Next, multiple transmission elements 400 are provided on the flexible circuit base boards 200A and 200B. In this way, the manufacturing of the flexible flat cable 100B is completed.

In summary, in the flexible flat cables disclosed in the above embodiments, each conductive structure is electrically connected to at least one conductive wire and one transmission signal pad, so that the flexible flat cable can be connected between two electronic devices having different connection distances without the use of an adapter board, thereby increasing the convenience of use. The conductive structures are covered by the cover film so that the flexible flat cables remain flat. The safety of use of the flexible flat cable can be improved via the fuse wires. The flexible flat cable can be facilitated to be repaired via the repair wires after the fuse wires are blown.

In addition, the flexible flat cable prevents the conductive wires, the transmission signal pads, and the collecting signal pads from being destroyed due to the cut-off holes by filling the cut-off holes with the cover film. The multiple flexible circuit base boards are stacked and can be connected to the same connector through the connecting terminals, so that the flexible flat cable including the flexible circuit base boards can capture more signals while space saving is achieved.

Although the present application has been disclosed as above in embodiments, the embodiments are not intended to limit the present application, and those of ordinary skill in the art may make some changes and embellishments within the spirit and scope of the present application, so that the scope of protection of the invention shall be defined in the attached Claims.

What is claimed is:

1. A flexible circuit base board, comprising:

a base film having a pair of sides that are opposite to each other;

a plurality of conductive wires that are spaced and placed side by side on the base film;

a transmission signal pad that is disposed on the base film, and is located between one of the sides and the conductive wires;

a conductive structure that is disposed on the base film, the conductive wires and the transmission signal pad, and is electrically connected to at least one of the conductive wires and the transmission signal pad; and a cover film that is disposed on the base film, and covers the conductive wires, the conductive structure and the transmission signal pad.

2. The flexible circuit base board according to claim 1, further comprising:

a collecting signal pad that is disposed between the base film and the cover film, and is located between one of the sides and the conductive wires, wherein the collecting signal pad is electrically connected to the transmission signal pad.

3. The flexible circuit base board according to claim 2, further comprising:

a fuse wire that is disposed between the base film and the cover film, and is connected to the transmission signal pad and the collecting signal pad.

4. The flexible circuit base board according to claim 3, further comprising:

a repair wire that is disposed between the base film and the cover film, wherein the repair wire is adjacent to the fuse wire and is not in contact with the fuse wire, and the repair wire is connected to one of the transmission signal pad and the collecting signal pad.

5. The flexible circuit base board according to claim 1, wherein the conductive wires respectively have a plurality of cut-off holes that are not covered by the conductive structure; and the cover film extends into the cut-off holes and is in contact with the base film.

6. The flexible circuit base board according to claim 1, wherein the conductive structure is an anisotropic conductive film or a solder paste.

7. A flexible flat cable, comprising:

a first flexible circuit base board comprising:

a first base film having a pair of first sides that are opposite to each other;

a plurality of first conductive wires that are spaced and placed side by side on the first base film;

a first transmission signal pad that is disposed on the first base film, and is located between one of the first sides and the first conductive wires;

a first conductive structure that is disposed on the first base film, the first conductive wires and the first transmission signal pad, and is electrically connected to at least one of the first conductive wires and the first transmission signal pad;

a first collecting signal pad that is disposed on the first base film, and is located between one of the first sides and the first conductive wires, wherein the first collecting signal pad is electrically connected to the first transmission signal pad; and a first cover film that is disposed on the first base film, and covers the first conductive wires, the first conductive structure, the first transmission signal pad, and the first collecting signal pad; and a first transmission element that is electrically connected to the first collecting signal pad, the first transmission element and the first conductive structure defining an electrical conduction through the first collecting signal pad, wherein the first transmission element does not cover the first conductive wires and protrudes beyond the pair of first sides.

8. The flexible flat cable according to claim 7, wherein the first flexible circuit base board further comprises a first fuse wire, wherein the first fuse wire is disposed between the first base film and the first cover film, and is connected to the first transmission signal pad and the first collecting signal pad.

9. The flexible flat cable according to claim 8, wherein the first flexible circuit base board further comprises a first repair wire that is disposed between the first base film and the first cover film, wherein the first repair wire is adjacent to the first fuse wire and is not in contact with the first fuse wire, and the first repair wire is connected to one of the first transmission signal pad and the first collecting signal pad.

10. The flexible flat cable according to claim 7, wherein the first conductive structure is an anisotropic conductive film or a solder paste.

11. The flexible flat cable according to claim 7, further comprising:

a second flexible circuit base board, wherein the second flexible circuit base board and the first flexible circuit base board are stacked.

12. The flexible flat cable according to claim 11, wherein the second flexible circuit base board comprises:

a second base film having a pair of second sides that are opposite to each other;

a plurality of second conductive wires that are spaced and placed side by side on the second base film;

a second transmission signal pad that is disposed on the second base film, and is located between one of the second sides and the second conductive wires;

a second conductive structure that is disposed on the second base film, the second conductive wires and the second transmission signal pad, and is electrically connected to at least one of the second conductive wires and the second transmission signal pad; and a second cover film that is disposed on the second base film, and covers the second conductive wires, the second conductive structure and the second transmission signal pad, and wherein the pair of second sides protrudes beyond the pair of first sides.

13. The flexible flat cable according to claim 12, further comprising:

a plurality of connecting terminals that are disposed at end portions of the first conductive wires and end portions of the second conductive wires, respectively, and wherein the connecting terminals disposed at the first conductive wires overlap with the connecting terminals disposed at the second conductive wires, respectively.

14. The flexible flat cable according to claim 12, further comprising a second transmission element;

wherein the second flexible circuit base board further comprises:

a second collecting signal pad that is disposed between the second base film and the second cover film, and is located between one of the second sides and the second conductive wires, where the second collecting signal pad is electrically connected to the second transmission signal pad, and the second collecting signal pad does not overlap with the first collecting signal pad, and wherein the second transmission element is electrically connected to the second collecting signal pad, and the second transmission element does not cover the second conductive wires and protrudes beyond the pair of second sides, and the second transmission element does not overlap with the first transmission element.

15. The flexible flat cable according to claim 14, wherein the second flexible circuit base board further comprises a second fuse wire, wherein the second fuse wire is disposed between the second base film and the second cover film, and is connected to the second transmission signal pad and the second collecting signal pad.

16. The flexible flat cable according to claim 15, wherein the second flexible circuit base board further comprises a second repair wire that is disposed between the second base film and the second cover film, wherein the second repair wire is adjacent to the second fuse wire and is not in contact with the second fuse wire, and the second repair wire is connected to one of the second transmission signal pad and the second collecting signal pad.

17. The flexible flat cable according to claim 12, wherein the second conductive structure is an anisotropic conductive film or a solder paste.

* * * * *